US009851379B2

(12) United States Patent
Dang et al.

(10) Patent No.: US 9,851,379 B2
(45) Date of Patent: Dec. 26, 2017

(54) TEST PROBE SUBSTRATE

(71) Applicant: International Business Machines Corporation, Armonk, NY (US)

(72) Inventors: Bing Dang, Chappaqua, NY (US); John U. Knickerbocker, Yorktown Heights, NY (US); Jae-Woong Nah, New York, NY (US); Robert E. Trzcinski, Rhinebeck, NY (US); Cornelia Kang-I Tsang, Mohegan Lake, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/469,497

(22) Filed: Mar. 25, 2017

(65) Prior Publication Data

US 2017/0199227 A1    Jul. 13, 2017

Related U.S. Application Data

(63) Continuation of application No. 14/495,606, filed on Sep. 24, 2014, now Pat. No. 9,606,142.

(51) Int. Cl.
*H01L 21/8242* (2006.01)
*G01R 3/00* (2006.01)
(Continued)

(52) U.S. Cl.
CPC .............. *G01R 3/00* (2013.01); *G01R 1/0408* (2013.01); *G01R 1/06761* (2013.01);
(Continued)

(58) Field of Classification Search
CPC . H01L 2224/73265; H01L 2224/32145; H01L 2224/0401; H01L 2924/014
See application file for complete search history.

(56) References Cited

U.S. PATENT DOCUMENTS 7,468,545 B2    12/2008    Lin et al.
7,589,544 B2    9/2009    Nakayama
(Continued)

FOREIGN PATENT DOCUMENTS

JP    2010533861    10/2010
JP    2011117761    6/2011
(Continued)

OTHER PUBLICATIONS

Bing Dang et al., unpublished U.S. Appl. No. 15/469,501, filed Mar. 25, 2017, Test Probe Substrate, pp. 1-17 plus 5 sheets drawings.
(Continued)

*Primary Examiner* — Zandra Smith
*Assistant Examiner* — John M Parker
(74) *Attorney, Agent, or Firm* — Louis J. Percello; Otterstedt, Ellenbogen & Kammer, LLP

(57) ABSTRACT

A test probe structure having a planar surface and contact locations matched to test hardware is provided. The fabrication of the test probe structure addresses problems related to the possible deformation of base substrates during manufacture. Positional accuracy of contact locations and planarity of base substrates is achieved using dielectric layers, laser ablation, injection molded solder or redistribution layer wiring, and planarization techniques.

17 Claims, 5 Drawing Sheets

(51) Int. Cl.
*G01R 1/04* (2006.01)
*G01R 1/067* (2006.01)
*H01L 21/66* (2006.01)

(52) U.S. Cl.
CPC ...... *H01L 22/30* (2013.01); *H01L 2224/0401* (2013.01); *H01L 2224/32145* (2013.01); *H01L 2224/73265* (2013.01); *H01L 2924/014* (2013.01)

(56) References Cited

U.S. PATENT DOCUMENTS

| | | | |
|---|---|---|---|
| 7,629,805 | B2 | 12/2009 | Li |
| 7,977,783 | B1 | 7/2011 | Park et al. |
| 8,222,913 | B2 | 7/2012 | Lee |
| 9,257,333 | B2 | 2/2016 | Lu et al. |
| 9,305,856 | B2 | 4/2016 | Chen et al. |
| 2005/0093176 | A1* | 5/2005 | Hung ............ H01L 24/05 257/786 |
| 2007/0132468 | A1 | 6/2007 | Nakayama |
| 2007/0228110 | A1 | 10/2007 | Eldridge et al. |
| 2008/0211093 | A1 | 9/2008 | Ke et al. |
| 2009/0146675 | A1 | 6/2009 | Karklin |
| 2010/0133686 | A1 | 6/2010 | Chu et al. |
| 2011/0057678 | A1 | 3/2011 | Kato |
| 2011/0148447 | A1 | 6/2011 | Yoo |
| 2012/0013360 | A1 | 1/2012 | Oh |
| 2013/0015440 | A1 | 1/2013 | Dang |
| 2015/0102506 | A1 | 4/2015 | Song et al. |
| 2016/0084876 | A1 | 3/2016 | Dang et al. |

FOREIGN PATENT DOCUMENTS

| | | |
|---|---|---|
| KR | 100682578 B1 | 2/2007 |
| KR | 20090126494 A | 12/2009 |
| KR | 100971732 B1 | 7/2010 |
| WO | WO2009011696 | 1/2009 |

OTHER PUBLICATIONS

List of IBM Patents or Patent Applications Treated As Related, Mar. 25, 2017, pp. 1-2.

* cited by examiner

TEST PROBE SUBSTRATE

CROSS REFERENCE TO RELATED APPLICATION

This application is a continuation of U.S. patent application Ser. No. 14/495,606 filed Sep. 24, 2014, the complete disclosure of which is expressly incorporated herein by reference in its entirety for all purposes.

FIELD

The present disclosure relates to the physical sciences, and, more particularly, to test probe structures and methods of fabrication thereof.

BACKGROUND

Integrated circuits can be mass produced by forming arrays of chips on semiconductor wafers. The wafers can be subsequently diced in order to form dies, each die including a circuit. Test probes are employed for testing integrated circuits, either as parts of a wafer or as discrete chips. The electrical characteristics of an integrated circuit are tested to ensure they conform to specifications and/or will perform as intended. Integrated circuit chips include surface contacts comprised of contact pads, solder bumps (e.g. C4 bumps), or other types of electrical contacts. Conductors corresponding to the surface contact locations of the integrated circuit chips are provided on test probes.

SUMMARY

Principles of the present disclosure provide an exemplary fabrication method that includes obtaining a structure comprising a test probe substrate including a top surface, one or more contact locations, and electrical conductors within the substrate, the contact locations being electrically connected to one or more of the electrical conductors, and forming a first dielectric layer over the top surface of the substrate. A plurality of first openings is formed within the first dielectric layer, thereby exposing the contact locations. Lateral extensions of one or more of the openings are formed within the first dielectric layer. An electrically conductive material is deposited within the first openings and lateral extensions. The method further includes depositing a second dielectric layer over the first dielectric layer and forming a plurality of second openings within the second dielectric layer, one or more of the second openings communicating with the lateral extensions. An electrically conductive material is deposited within the second openings to form an array of electrical contact regions electrically connected to the contact locations. The second dielectric layer is planarized.

A further exemplary fabrication method includes obtaining a test probe substrate including a top surface and a plurality of contact locations electrically connected to one or more electrical conductors and determining whether the contact locations match predetermined coordinate positions. A first dielectric layer is formed over the top surface of the substrate and a plurality of first openings are formed within the first dielectric layer, thereby exposing a plurality of the contact locations. Lateral extensions of the first openings are formed in the directions of the predetermined coordinate positions for the contact locations that do not match the predetermined coordinate positions. An electrically conductive material is deposited within the first openings and lateral extensions such that the conductive material contacts the contact locations. A second dielectric layer is deposited over the first dielectric layer. A plurality of second openings are formed within the second dielectric layer matching the predetermined coordinate positions, one or more of the second openings communicating with the lateral extensions. An electrically conductive material is deposited within the second openings to form an array of electrical contact regions electrically connected to the contact locations and conforming to the predetermined coordinate positions. The second dielectric layer is planarized.

A test probe structure in accordance with an exemplary embodiment includes a substrate including a top surface, a plurality of rows of contact locations, and electrical conductors within the substrate, the contact locations being electrically connected to one or more of the electrical conductors, one or more of the contact locations being misaligned with respect to one or more of the rows. A first dielectric layer is on the top surface of the substrate. A plurality of first openings corresponding to the contact locations extend through the first dielectric layer, each of the first openings being aligned with a corresponding one of the contact locations. At least one of the first openings corresponds to one of the misaligned contact locations and includes a lateral extension. A second dielectric layer is positioned over the first dielectric layer. A plurality of second openings extends through the second dielectric layer, the second openings being arranged in rows corresponding to the rows of contact locations. The second openings are arranged in rows without misalignment. An electrically conductive material is within each of the first and second openings and the lateral extension, the electrically conductive material contacting the contact locations. The second dielectric layer includes a planar top surface.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Test probe structures and fabrication methods as disclosed herein can provide substantial beneficial technical effects. For example, one or more embodiments may provide one or more of the following advantages:

Effective use of probe substrate materials subject to distortion;
Corrections for non-planarity of probe substrates;
Corrections for positional inaccuracy of probe contact locations;
Enables use of LTCC (low temperature co-fire ceramic) substrate or glass or silicon substrates, which have a coefficient of thermal expansion near or matched to silicon;
Enables use of high modulus substrate base such as LTCC substrate to both facilitate uniformity of applied force to probes on substrate and to minimize non-coplanarity of probes with or without applied mechanical force and across temperature ranges of testing dies and/or wafers;
Effective design of wafer probe substrate to support high power delivery during test (current) and low voltage to support full power/pulsed power and at speed testing of circuits.

Power levels of >200 watts per die and current of 0.1 amps per pin to over 1 amp per pin are possible with proper choice of base substrate, probe and low contact resistance;

Effective design of wafer probe substrate to support low frequency (MHz) to high frequency (GHz) test measurements such as with using short distance connections, appropriate pitch/spacing of input-output signals and shielded wiring;

Enables use of single die to multiple die or wafer level test probe substrates, providing flexibility to have high throughput to meet low cost and volume applications;

Testing of multiple products using the same test probe substrates.

These and other features and advantages will become apparent from the following detailed description of illustrative embodiments thereof, which is to be read in connection with the accompanying drawings.

DETAILED DESCRIPTION

Test probes used for testing integrated circuits include electrical contacts intended for contacting surface pads or other contact structures formed on IC chips. Such contact structures may be employed for power connections or I/O signals. Substrate materials employed for fabricating test probes may be subject to deformation, thereby causing misalignment of the electrical contacts on the test probe substrate. Ceramic substrate materials, for example, offer good strength and rigidity. Such substrates are typically fabricated using a sintering process. Wiring layers are formed within the substrate, which may comprise ceramic layers, for electrically connecting the probe contacts with testing equipment. The ceramic material undergoes shrinkage and possible distortion if the shrinkage is non-uniform. Such distortion can result in misalignment of the electrical contacts on the probe substrate with the corresponding contacts on an integrated circuit to be tested. It can further result in a loss of planarity of the surface that includes the electrical contacts.

Figure 1:
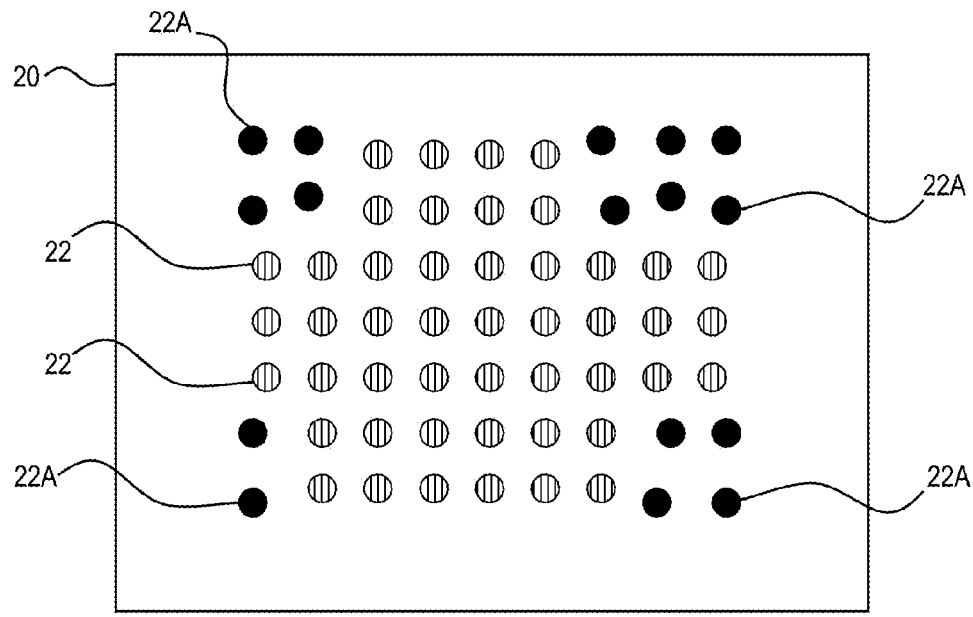
FIG. 1 is a schematic top plan illustration of a test probe substrate base including a plurality of vias or via pads, some of which are not in position to match test hardware.

Referring to FIG. 1, a top plan view of a test probe substrate base following a sintering process is provided. In one or more embodiments, the substrate base comprises LTCC (low temperature co-fire ceramic) having a coefficient of thermal expansion near or matched to silicon so probes can support tests at die level up to wafer level across a range of temperatures from less than 0° C. to greater than 100° C. The use of a high modulus ceramic substrate base such as an LTCC substrate facilitates uniformity of the applied force when the probe is employed for testing and minimizes non-coplanarity of probes with or without applied mechanical force and across the temperature range(s) of the testing dies and/or wafers. As shown schematically, contact locations 22, 22A forming rows of via conductors or via pads are formed in the substrate 20. The contact locations are on the substrate surface in the exemplary embodiment. Electrical conductors within the substrate 20 are electrically coupled to the via conductors or via pads. The electrical conductors may be comprised, at least in part, by the via conductors. The array of such via conductors or pads exposed at the illustrated surface of the substrate base is intended to correspond in some embodiments to surface contacts of an integrated circuit or other electronic device to be tested. In this exemplary embodiment, the arrangement of the rows and columns of via conductors or via pads only partially conforms to the desired configuration wherein the rows and columns would be parallel and the via conductors or via pads would be equally spaced. In some test probe substrates, such as ceramic substrates, distortion tends to be greater near the periphery of the surface than near the middle portion thereof. As shown in FIG. 1, some of the contact locations 22A at the corner portions of the array are misaligned. The rows of contact locations are accordingly not entirely linear nor are the rows entirely parallel to each other as desired. In addition to the positional inaccuracy of the contact locations 22A, the illustrated surface is non-planar. The X, Y and Z coordinates of some of the contact locations accordingly are not suitable for matching the test hardware (not shown). The contact locations 22, 22A are mapped and stored, preferably electronically in a memory device, for future reference. These locations are compared to a set of predetermined coordinate positions that, for example, match the coordinate positions of the electrical contact surfaces of test hardware. As discussed below, the positional inaccuracy of the contact locations and non-planarity of the base substrate are both addressed in order to provide probe compatibility with the electronic devices to be tested and/or intermediate structures.

Figure 2:
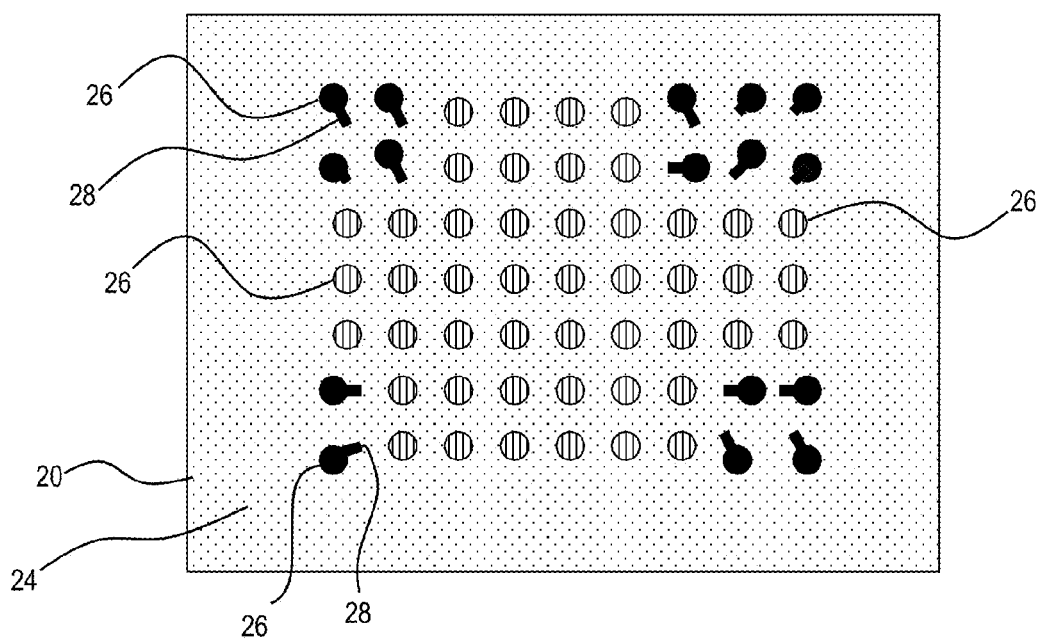
FIG. 2 is a schematic top plan illustration of the substrate of FIG. 1 including a dielectric layer formed thereon and processed to provide openings in the dielectric layer.

Referring to FIG. 2, a first dielectric layer 24 is provided on the surface of the substrate 20 shown in FIG. 1. In one exemplary embodiment, the first dielectric layer comprises a polyimide adhesive that is laminated or spun on the base substrate 20 and cured. In some exemplary embodiments, a polyimide adhesive layer having a thickness between three and ten microns is formed. A thicker dielectric layer, for example between fifty and one hundred microns, may be employed in other embodiments. The dielectric layer 24 may comprise a single layer or a series of layers. A mask (not shown) is provided on the dielectric layer 24. The mask facilitates patterning of the dielectric layer to open the contact locations 22, 22A through use of the stored data relating to contact location positions. A laser is employed in some embodiments to cut through the dielectric layer 24. As shown in FIG. 2, the openings 26 in the dielectric formed by laser ablation are round where the contact locations 22 are satisfactory. With respect to the contact locations 22A that are not in true X, Y and/or Z coordinate positions, tails 28 are formed in the dielectric layer 24 that extend from the round openings in the appropriate directions. The round portions of the openings are in registration with the contact locations 22, 22A while the tails 28 extend in the directions of the correct locations for matching to test hardware or other elements. It will be appreciated that the openings 26 may include laterally extending portions having configurations that differ from those of the tails 28 shown in the figures.

Figure 3:
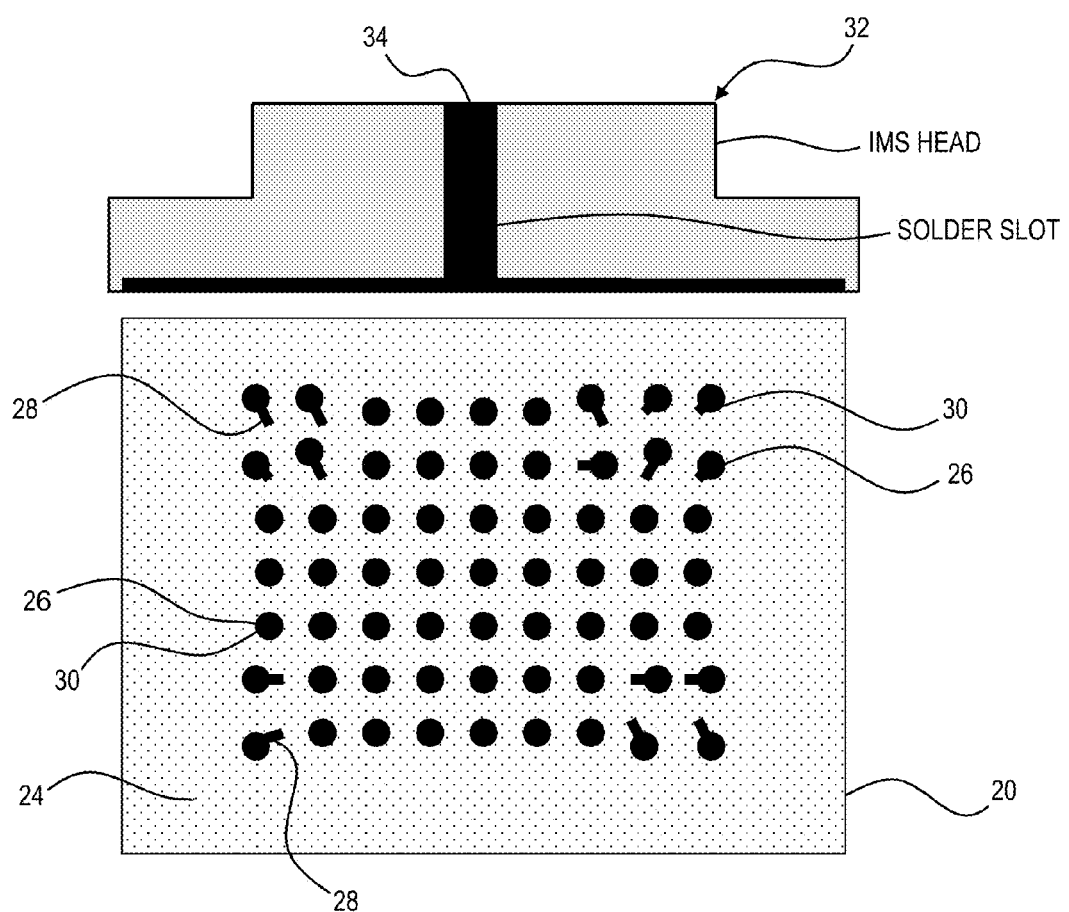
FIG. 3 is a schematic illustration showing a solder injection head and the substrate following injection of molten solder within the openings in the dielectric layer.

Referring to FIG. 3, wiring 30 is provided by the injection of molten solder into the openings 26 and tails 28 in one exemplary embodiment. This may be accomplished by passing an injection mold solder (IMS) head 32 over the surface of the patterned dielectric layer 24 formed on the base substrate 20. The head 32 includes a solder slot 34 that provides molten solder to the surface of the dielectric layer, filling the openings 26 down to the contact locations 22, 22A as well as filling the laterally extending tails 28. The solder injection process is conducted in a low oxygen environment, preferably less than 10,000 ppm oxygen in a nitrogen or forming gas environment. The IMS head 32 may further include an optional blade (not shown) that contacts the surface of the dielectric layer to prevent solder leakage. U.S. Pat. Nos. 5,244,143 and 7,784,673, which are incorporated by reference, disclose techniques and apparatus for filling cavities with molten solder. The contact locations 22, 22A may include a nickel/gold finish or other suitable finish to facilitate wetting. The wiring 30 may be formed by processes other than molten solder injection. Exemplary processes include sputter deposited metallurgy and plated metallurgy. The surface of the substrate 20, which now includes the first dielectric layer 24, is planarized in some embodiments following the deposition of the wiring layer to provide a planar surface and to remove any excess metallurgy. Planarizing dielectric layer(s) formed prior to deposition of a final dielectric layer is beneficial when planarity is far from specification, but is not required when close to target specifications. As discussed above, in one or more exemplary embodiments, the contact locations are compared to a set of predetermined coordinate positions that correspond to the target specifications. This information is used to determine whether planarization can be satisfactorily effected by planarizing only the final dielectric layer or whether one or more intermediate dielectric layers, such as the first layer 24, requires planarization. In one exemplary embodiment, the dielectric layer has an initial thickness of about five microns. A grinding or chemical mechanical polishing (CMP) process is employed if appropriate to form a planar surface having an average thickness of about two microns. Typically, planarization is utilized for each deposition layer but is particularly important with respect to the final deposition layer if the targeted specification of the probe planarity has not been achieved (for example, 2 μm in some fine pitch probe testing applications). The thickness of the resulting dielectric layer 24 may or may not be uniform depending on the surface characteristics of the substrate 20.

In some embodiments, the deformation of the base substrate 20 may require the deposition of one or more additional dielectric and wiring layers. Each additional dielectric layer would be patterned and provided with corrective wiring to achieve positional accuracy using RDL (redistribution layer) processing. In one or more embodiments, openings and tails similar to those shown in FIG. 2 are formed in subsequent dielectric layers. Further processing (e.g. CMP) is preferably, though not necessarily, performed following deposition of each dielectric layer to obtain a substantially planar surface on the resulting structure and, if applicable, to facilitate the deposition of molten solder. As discussed above, planarization of the final dielectric layer may be particularly important to meet product specifications.

Figure 4:
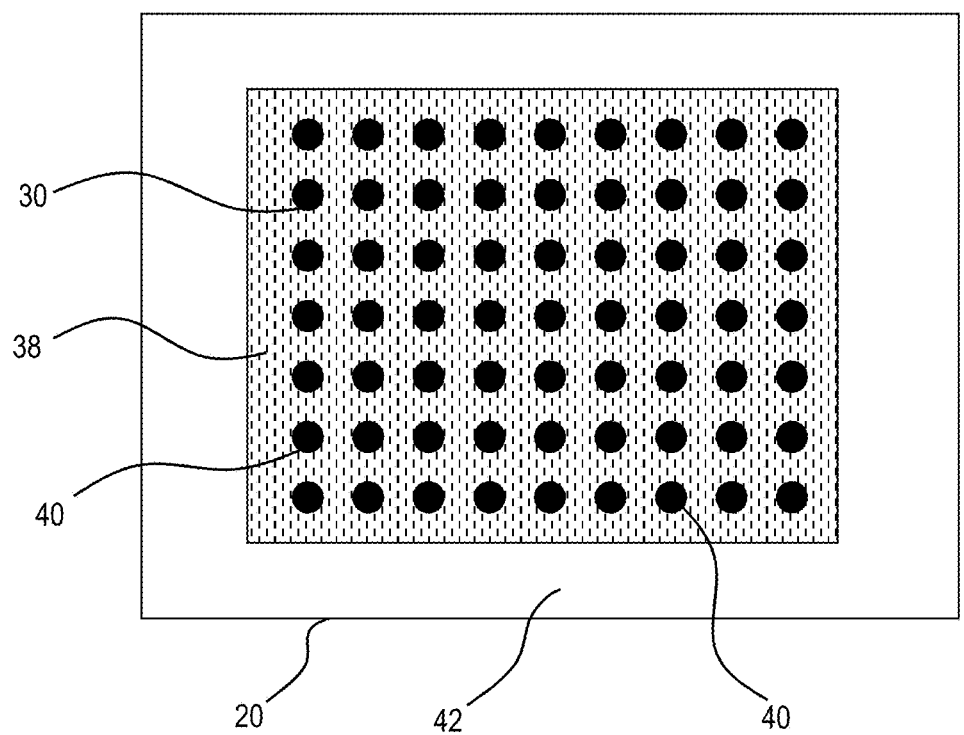
FIG. 4 is a schematic top plan illustration of the structure of FIG. 3 showing a second dielectric layer deposited on the substrate, opened to form a desired grid, and following injection of molten solder by the solder injection head.

Once the positional accuracy of the contact locations is acceptable via redistribution as described above, a final dielectric layer 38 may be deposited and patterned. In one exemplary embodiment, the final dielectric layer 38 is a second such layer deposited on the first layer 24. Openings 40 are formed in the dielectric layer 38 as shown in FIG. 4. Referring to FIG. 3 for exemplary purposes, some of the openings 40 are aligned with the contact locations 22 and openings 26 in the underlying dielectric layer 24. Other openings 40 are aligned with the tails 28 formed in the underlying dielectric layer 24 as the underlying contact locations 22A corresponding to some of the openings 40 are misaligned. As no further adjustment for contact location inaccuracy is necessary in this exemplary embodiment, none of the openings 40 requires an extension in any direction. The openings 40 within the final dielectric layer 38 which forms the top surface of the test probe substrate form parallel rows with no misaligned openings. In the exemplary embodiment of FIG. 4, the openings 40 are round. The openings can be formed by laser ablation or etching. The openings 40 are filled with an electrically conductive material such as solder. Exemplary materials for filling the openings 40 include Sn/Ag/Cu with Sn 96.5%,/Ag 2.5%/Cu 1%, SnCu with Sn 98.3%/Cu 1.7%, and $Cu_6/Sn_5$ or other metallic compounds. The dielectric layer 38 is planarized by CMP or other suitable process in one or more exemplary embodiments. An injection molded solder process as described above may again be employed to extend the wiring 30 formed in previous step(s). In some applications, the perimeter of the substrate 20 is removed by grinding to permit the contact area of the structure to extend above the level of the remaining portion of the substrate. A step 42 is accordingly formed in one or more embodiments.

Figure 5A:
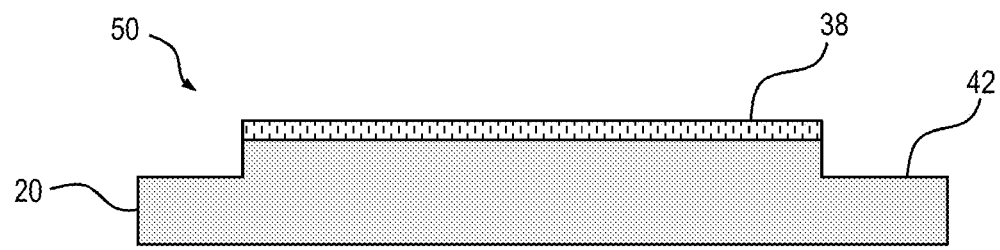
FIG. 5A is a schematic side elevation view of a first embodiment of a test probe structure formed in accordance with a first exemplary method.
Figure 5B:
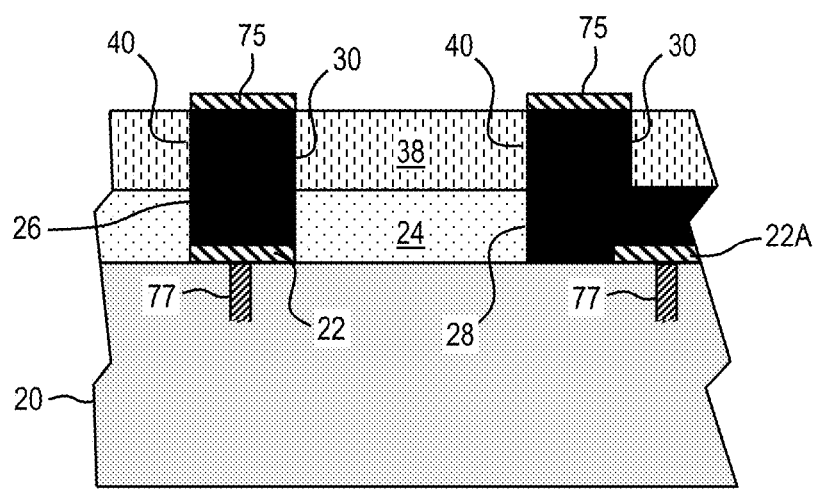
FIG. 5B is an enlarged sectional view of a portion of the structure shown in FIG. 5A.

Finish metallurgy is deposited in some embodiments and is in electrical communication with the previously formed wiring 30. Finish metallurgy may comprise copper having a finish layer of Ni/Au or alternative metallurgy that facilitates wetting. A test probe substrate 50 is shown in FIG. 5A. FIG. 5B shows such a test probe substrate including finish metallurgy. The finish metallurgy 75, such as Cu/Ni/Au, Cu/NiFe/Au, Ti/Cu/Ni/Au, TiW/Cu/Ni/Au, Cu/Ni/Pt or Cu/Ni/Rh or alternate composition are used to complete the structure for contact. The finish metallurgies may have a thin bonding metallurgy such as Ti or TiW of <0.1 μm, Cu, Ni or NiFe metallurgies on the order of 0.1 to 5 μm, or Au, Pt, Rh or other finish metallurgy of <0.5 μm. Finish metallurgy is usually deposited on top of underlying Cu or other metallurgical via or wire and is not used to fill openings such as described above with respect to FIG. 4. Wiring 77 within the substrate 20 and electrically contacting the contact locations 22, 22A of the probe substrate 20 is further shown in the schematic illustration.

Figure 6:
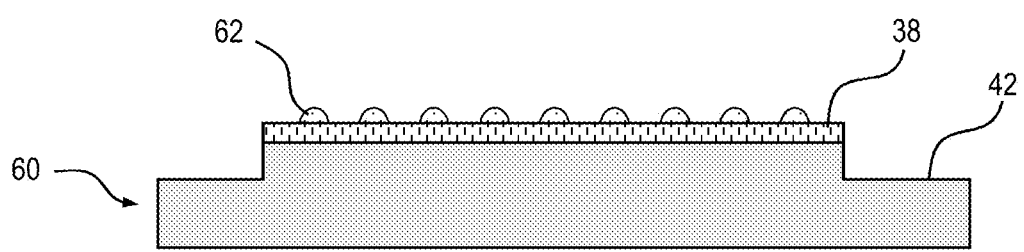
FIG. 6 is a schematic side elevation view of an alternative embodiment of a test probe structure formed in accordance with the steps shown in FIGS. 1-4.

In an alternative embodiment, the finish metallurgy may comprise copper pillars having solder tips or solder interconnection bumps 62. The structure 60 shown in FIG. 6 is obtained in such a manner. The copper pillars may be formed by electroplating or other suitable process. The IMS head 32 may again be employed to fill the openings 40. In some embodiments, the solder may remain solder after fill. In other embodiments, a heat treatment causes conversion of the solder to an intermetallic compound such as $Cu_6Sn_5$ or alternate composition(s). The surface pads can have additional copper pillars (not shown) plated with subsequent surface finishing metallurgy. Alternatively, the pads may include added solder by means of the IMS head 32 that injects molten solder to add height above the finished pads or finished pillar metallurgical structures. Bumps 62 extending above the surface of the dielectric layer 38 are formed upon solidification of the solder.

In one or more embodiments, copper pillars are formed in the openings 40 in the dielectric layer 38 or on top of finished metallurgy, for example copper pillars extending 5 to 40 μm above the filled openings. Alternatively, a solder deposited by IMS can fill the openings 40 or be deposited on top of the filled openings 40. Solder above the surface of the structure can be deposited through a mask (not shown) using IMS or can be otherwise filled into a resist (not shown) that has openings above the dielectric layer 38 and then resist stripped after filling. The bumps 62, like the openings 40 from which they extend, are arranged in parallel rows that are correctly aligned for interfacing with the surface contacts of the test substrate or an intermediate structure such as an interposer layer. The bumps are also substantially coplanar even though the surface of the underlying substrate 20 may not be.

Figure 7:
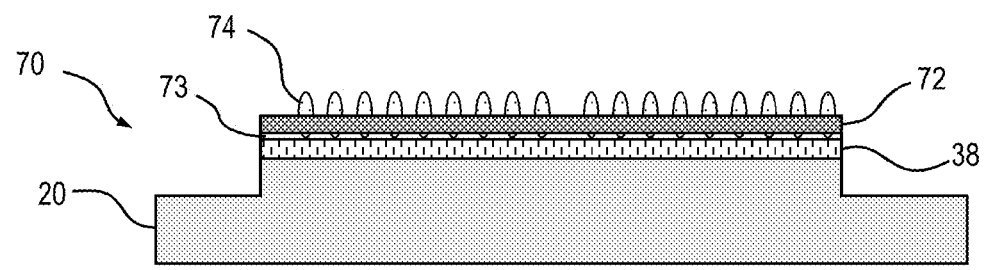
FIG. 7 is a schematic side elevation view of a further alternative embodiment of a test probe structure including an interposer layer.

A further alternative embodiment is shown in FIG. 7. Fine pitch test probes are required for some applications where the surface contacts of electronic devices to be tested have a pitch of about one hundred fifty microns or less. A test probe substrate 70 as shown in FIG. 7 is fabricated once a structure such as shown in FIG. 6 is obtained. A silicon interposer layer 72 (or layers) is attached to the structure using flip chip attachment (controlled collapse chip attachment) techniques, thermal compression bonding (with or without integrated adhesive and interconnections) or alternative attachment techniques. An adhesive underfill 73 is applied in one or more embodiments. The interposer layer 72 is configured (wired) to function as a redistribution layer wherein the pitch of the wiring layer 30 formed on the substrate 20 is transposed to the pitch required for the wafer to be tested. The silicon interposer layer 72 includes probe tips 74 in one or more embodiments conforming to the layout of surface contacts of the integrated circuit or other device to be tested. In some embodiments, the probe tips comprise shaped copper pads with contact metal deposition such as Ni/Au or Pt or alternative metallurgy. The interposer layer is likely to be used for transposing a relatively large pitch layout (e.g. two hundred microns), such as the layout of bumps 62 shown in the exemplary embodiment of FIG. 6, to a layout of probe tips 74 having a finer layout (e.g. one hundred microns) for wafer testing. The interposer layer 72 is planar and the contacts on the interposer for interfacing with the contact regions (e.g. bumps 62) of the underlying structure (e.g. structure 60) are also coplanar. The planarity of the contact surface formed by the final dielectric layer 38 and correct alignment of the contact regions associated with the contact surface accordingly facilitate proper attachment to the interposer layer 72.

Given the discussion thus far, an exemplary fabrication method includes obtaining a structure comprising a probe substrate 20 including a top surface, one or more contact locations 22, 22A, and electrical conductors 77 within the substrate, the contact locations being electrically connected to one or more of the electrical conductors and forming a first dielectric layer 24 over the top surface of the substrate. A plurality of first openings 26 is formed within the first dielectric layer 24, thereby exposing a plurality of the contact locations. Lateral extensions, for example tails 28 as shown in FIG. 2, of one or more of the openings 26 are formed within the first dielectric layer. An electrically conductive material 30 is deposited within the first openings 26 and lateral extensions 28. The method further includes depositing a second dielectric layer 38 over the first dielectric layer and forming a plurality of second openings 40 within the second dielectric layer, one or more of the second openings communicating with the lateral extensions. An electrically conductive material 30 is deposited within the second openings to form an array of electrical contact regions electrically connected to the contact locations. The second dielectric layer is planarized. In one or more embodiments, the step of depositing an electrically conductive material within the first openings 26 and lateral extensions 28 includes injecting molten solder, such as illustrated in FIG. 3. In some embodiments, the substrate is comprised of ceramic material (e.g. LTCC) and the first dielectric layer 24 comprises a polyimide adhesive. Substrates formed from glass, silicon, and organic materials are employed in other embodiments. Some embodiments of the exemplary method further include the steps of attaching an interposer layer 72 having a bottom surface and a top surface to the substrate over the second dielectric layer, the interposer layer including electrically conductive probe tips 74 extending from the top surface of the interposer layer, and causing the electrical connection (for example by solder reflow) of the probe tips to the contact locations of the substrate. FIG. 7 shows a structure 70 including such an interposer layer. In some embodiments, the second dielectric layer 38 is deposited directly on the first dielectric layer 24. In other embodiments, intermediate dielectric layers are formed between the first and second dielectric layers. Finish metallurgy 75 is formed on the contact regions in some embodiments, as shown for example in FIG. 5B. Both the first and second dielectric layers are planarized in one or more embodiments. The method may further include the steps of mapping three dimensional (x, y and z) coordinates of the contact locations 22, 22A, storing the mapped coordinates electronically in a memory device, comparing the stored coordinates to a set of predetermined coordinate positions, and determining a set of stored coordinates that do not match the set of predetermined coordinate positions. At least the step of forming the lateral extensions is performed using the set of stored coordinates that do not match the set of predetermined coordinate positions. As discussed above, the lateral extensions address the misalignment of contact locations. The stored coordinates may further be employed for controlling the planarizing of one or more dielectric layers.

A further exemplary fabrication method includes obtaining a test probe substrate 20 including a top surface and a plurality of contact locations 22, 22A electrically connected to one or more of the electrical conductors. The method further includes determining whether the contact locations 22, 22A match predetermined coordinate positions. A first dielectric layer 24 is formed over the top surface of the substrate and a plurality of first openings 26 are formed within the first dielectric layer, thereby exposing a plurality of the contact locations. Lateral extensions of the first openings are formed in the directions of the predetermined coordinate positions for the contact locations that do not match the predetermined coordinate positions. An electrically conductive material 30 is deposited within the first openings and lateral extensions such that the conductive material contacts the contact locations 22, 22A. A second dielectric layer 38 is deposited over the first dielectric layer. A plurality of second openings 40 are formed within the second dielectric layer matching the predetermined coordinate positions, one or more of the second openings communicating with the lateral extensions 28. An electrically conductive material 30 is deposited within the second openings 40 to form an array of electrical contact regions electrically connected to the contact locations and conforming to the predetermined coordinate positions. The second dielectric layer is planarized. In some embodiments, the second dielectric layer 38 is deposited on the first dielectric layer and the first dielectric layer 24 is deposited on the top surface of the substrate. As discussed above, the first dielectric layer 24 is planarized in some embodiments of the exemplary method.

A test probe structure in accordance with an exemplary embodiment includes a substrate 20 including a top surface, a plurality of rows of contact locations 22, 22A, and electrical conductors 77 within the substrate, the contact locations being electrically connected to one or more of the electrical conductors, one or more of the contact locations 22A being misaligned with respect to one or more of the rows. A first dielectric layer 24 is on the top surface of the substrate. A plurality of first openings 26 corresponding to the contact locations extend through the first dielectric layer 24, each of the first openings being aligned with a corresponding one of the contact locations. At least one of the first openings corresponds to one of the misaligned contact locations 22A and includes a lateral extension 28. A second dielectric layer 38 is positioned over the first dielectric layer. A plurality of second openings 40 extends through the second dielectric layer, the second openings being arranged in rows corresponding to the rows of contact locations 22, 22A. The second openings are arranged in rows without misalignment. An electrically conductive material 30 is within each of the first and second openings and the lateral extension, the electrically conductive material contacting the contact locations. The second dielectric layer includes a planar top surface.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step plus function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

What is claimed is:

1. A method comprising:
    obtaining a structure comprising a test probe substrate including a top surface, a plurality of first and second contact locations arranged in rows and columns, one or more of the second contact locations being misaligned with respect to the first contact locations, and electrical conductors within the substrate, the first and second contact locations being electrically connected to one or more of the electrical conductors;
    forming a first dielectric layer over the top surface of the substrate;
    forming a plurality of first openings within the first dielectric layer, each of the first openings corresponding to one of the first and second contact locations;
    forming one or more lateral extensions of the first openings that correspond to the one or more misaligned second contact locations within the first dielectric layer, each of the one or more lateral extensions extending radially with respect to one of the first openings;
    depositing an electrically conductive material within the first openings and lateral extensions such that the electrically conductive material contacts the first and second contact locations;
    depositing a second dielectric layer over the first dielectric layer;
    forming a plurality of second openings within the second dielectric layer, the plurality of second openings being arranged in parallel rows without misalignment, one or more of the second openings being aligned with and communicating with the one or more lateral extensions, others of the second openings being aligned with the first openings that correspond to the first contact locations;
    depositing an additional electrically conductive material within the second openings to form an array of electrical contact regions electrically connected to the first and second contact locations, and
    planarizing the second dielectric layer.

2. The method of claim 1, wherein the step of depositing the electrically conductive material within the first openings and the one or more lateral extensions includes injecting molten solder.

3. The method of claim 2, wherein the substrate is comprised of a ceramic material, glass, silicon or an organic material and the first dielectric layer comprises a dielectric adhesive.

4. The method of claim 2, further including the steps of attaching an interposer layer having a bottom surface and a top surface to the substrate over the second dielectric layer, the interposer layer including electrically conductive probe tips extending from the top surface of the interposer layer, and causing the electrical connection of the probe tips to the contact locations of the substrate.

5. The method of claim 4, wherein the step of causing the electrical connection of the probe tips to the contact locations of the substrate includes causing solder reflow between the electrical contact regions and the bottom surface of the interposer layer.

6. The method of claim 5, wherein the second dielectric layer is deposited directly on the first dielectric layer and the first dielectric layer is deposited on the top surface of the substrate.

7. The method of claim 1, further including the step of planarizing the first dielectric layer.

8. The method of claim 1, further including the steps of mapping three dimensional coordinates of the contact locations, storing the mapped coordinates electronically in a memory device, comparing the stored coordinates to a set of predetermined coordinate positions, determining a set of stored coordinates that do not match the set of predetermined coordinate positions, wherein at least the step of forming the one or more lateral extensions is performed using the set of stored coordinates that do not match the set of predetermined coordinate positions.

9. The method of claim 1, wherein the one or more second contact locations includes a plurality of second contact locations misaligned with respect to the first contact locations, the one or more lateral extensions including a plurality of lateral extensions.

10. The method of claim 9, further including planarizing the first dielectric layer following depositing the electrically conductive material.

11. The method of claim 9, wherein the first openings include round portions and the lateral extensions comprise tails extending radially from the round portions, each of the tails extending in one of a plurality of selected directions with respect to the round portions of the plurality of first openings.

12. The method of claim 11, wherein the rows of first and second contact locations are not entirely parallel to each other.

13. The method of claim 12, wherein the substrate is a low temperature co-fire ceramic substrate.

14. The method of claim 12, further including depositing finish metallurgy on the electrical contact regions, the finish metallurgy being positioned above each of the second openings.

15. The method of claim 14, wherein the finish metallurgy comprises solder interconnection bumps.

16. The method of claim 1, further including determining whether the second contact locations are misaligned by comparing the first and second contact locations with a set of coordinate positions of an electrical contact surface of test hardware.

17. The method of claim 16, wherein forming the one or more lateral extensions of the first openings further includes extending the lateral extensions in one or more directions based on the coordinate positions of the electrical contact surface of the test hardware.

* * * * *